March 1, 1960 C. R. WILHELMSEN 2,927,204

MULTIPLE UNIT TRANSISTOR CIRCUIT WITH MEANS FOR MAINTAINING COMMON ZONE AT A FIXED REFERENCE POTENTIAL

Filed Jan. 22, 1957

2,927,204

MULTIPLE UNIT TRANSISTOR CIRCUIT WITH MEANS FOR MAINTAINING COMMON ZONE AT A FIXED REFERENCE POTENTIAL

Carl R. Wilhelmsen, Huntington Station, N.Y., assignor to Hazeltine Research, Inc., Chicago, Ill., a corporation of Illinois Application January 22, 1957, Serial No. 635,330

13 Claims. (Cl. 250—20)

*General*

Figure 1:
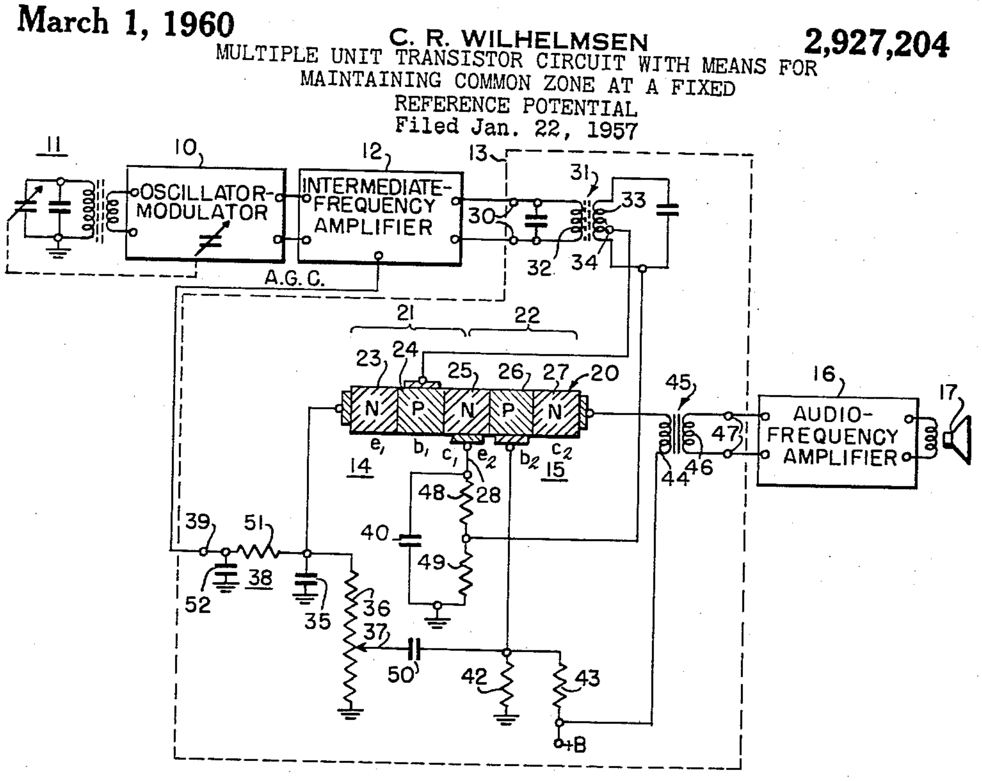

The present invention is directed to signal-translating systems and, more particularly, to such systems which employ multiple-unit transistor devices. While signal-translating systems of the type just mentioned have a variety of applications, they are particularly useful in radio equipment such as radio receivers. To that end they have utility wherein the individual units may serve as portions of cascade-connected amplifiers, converter intermediate-frequency amplifier stages, detector audio-frequency amplifier stages, intermediate-frequency audio-frequency amplifier stages and various other combinations of stages for a radio receiver. As employed in the text and the claims, the term "signal-translating system" is intended to denote any one of various combinations of stages such as those mentioned above regardless of whether the signals translated by the individual stages lie in the same or widely different frequency ranges.

The use of transistors in radio receivers is becoming more widespread. The usual transistorized receiver marketed today ordinarily includes six transistors, one in the converter or oscillator—modulator stage, one in each of the two intermediate-frequency amplifier stages, another in the audio-frequency driver stage, and two in the push-pull audio-frequency output stage. Transistors are presently more costly than any electron tubes and, despite their outstanding advantages over electron tubes for many applications, this cost has prevented the wider manufacture of transistorized radio receivers.

In copending application Serial No. 567,278, filed February 23, 1956, now abandoned, in the names of Richard J. Farber and Alexander Proudfit, there is described and claimed a cascade-connected transistor signal-translating system which may be in the form of a two-stage intermediate-frequency amplifier that makes use of a multiple-unit junction transistor. The multiple-unit transistor comprises an integral stack of five semiconductive layers, alternate ones of which are of the opposite conductivity type. The third or middle layer serves not only as the collector for the first transistor but also as the emitter for the second transistor, thereby eliminating the need for external conductive connections therebetween. The first transistor is connected in the common-emitter configuration, the emitter being grounded for alternating-current signals, and the second transistor is connected in the common-base configuration, that base also being at ground potential. Such an amplifier is economical and affords excellent isolation between the input and output circuits.

In the amplifier just described the same signal currents flow through the two junction transistors of the multiple-unit device. It has appeared to be desirable to use multiple-unit transistor devices in some applications wherein the signal currents flowing in the two transistors of the devices were quite different. For example, it has been felt that the cost of a transistorized radio receiver might be reduced if multiple-unit transistor devices could be employed to translate independently intermediate-frequency information in one unit of the device and audio-frequency information in the other thereof, or wherein one unit would serve as a frequency converter handling radio-frequency and intermediate-frequency information and the other unit would serve to amplify audio-frequency information. Insofar as applicant is aware, multiple-unit transistor devices capable of use in radio receivers have not been operated successfully as two electrically independent transistor circuits with reference to the signal currents appearing in the two units of the transistor device.

It is an object of the invention, therefore, to provide a new and improved signal-translating system employing a multiple-unit transistor device including junction transistors wherein each unit is capable of performing a function distinctly different from that of the other unit.

It is another object of the invention to provide a new and improved signal-translating system which includes two junction transistor circuits that operate as two electrically independent circuits with reference to the signals translated by each thereof.

It is an additional object of the invention to provide for use in a radio receiver a new and improved signal-translating system which includes a multiple-unit junction transistor device wherein the units thereof may be operated in widely different frequency ranges.

In accordance with a particular form of the invention, a signal-translating system comprises a multiple-unit transistor device including a pair of junction transistors which have a common zone of simiconductive material serving as the collector of one of said transistors and as the emitter of the other of said transistors and an electrical connection to said common zone. The system also includes a first signal-translating circuit including one of those transistors and a second signal-translating circuit including the other thereof. The signal-translating system additionally includes means for coupling a signal input terminal of the first circuit and a signal output terminal of the second circuit to a common point of reference potential for respective alternating-current signals respectively translated thereby. Finally, the system comprises means in those circuits engaging the foregoing connection to the common zone of both transistors for maintaining that zone at said reference potential for at least such translated signals. The result is to obtain desired independent operation of both circuits with respect to those signals respectively in each of them.

For a better understanding of the present invention, together with other and further objects thereof, reference is had to the following description taken in connection with the accompanying drawings, and its scope will be pointed out in the appended claims.

Figure 2:
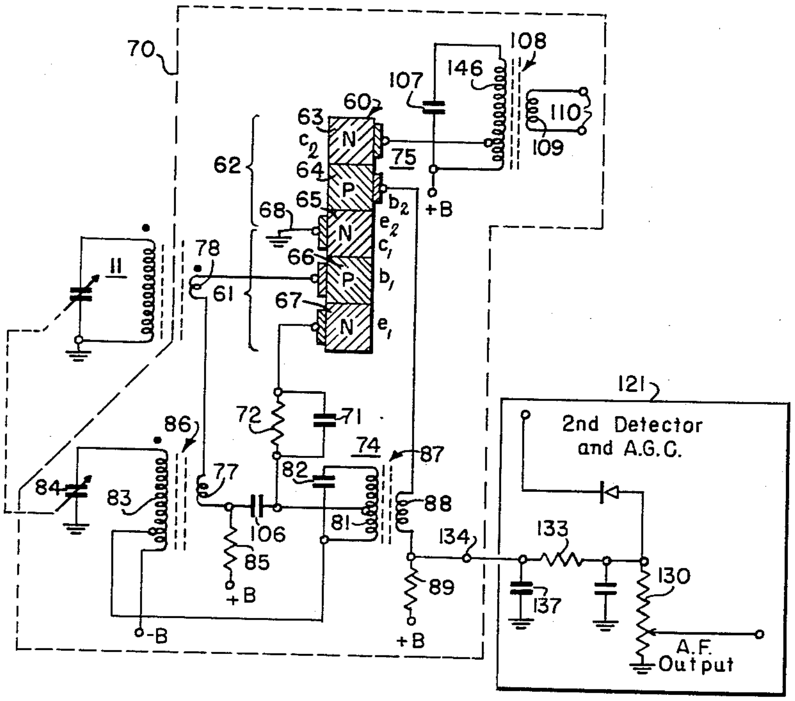

Referring to the drawings:

Fig. 1 is a circuit diagram partly schematic with a complete radio broadcast receiver which includes a signal-translating system embodying the present invention in a particular form, and Fig. 2 is a circuit diagram of an oscillator-modulator in accordance with another embodiment of the present invention for use in a radio receiver.

*General description of Fig. 1 receiver*

Referring now to Fig. 1 of the drawings, there is represented a complete radio broadcast receiver which utilizes a signal-translating system embodying a particular form of the present invention. In general, the receiver includes a frequency converter or oscillator-modulator 10 having a received wave-signal input circuit constituting an antenna system such as one commonly referred to in the art as a "ferrite rod antenna" 11 and having its output circuit coupled to an intermediate-frequency amplifier 12 of one or more stages. The intermediate-frequency amplifier is connected in cascade with a signal-translating system 13 in accordance with one embodiment of the present invention. This system includes a modulation-signal detector 14 and an audio-frequency amplifier 15, the output circuit of the latter being connected in cascade with a further audio-frequency amplifier 16 and a sound-reproducing device 17. While the detector 14 may be one of the type for deriving the modulation-signal components of an amplitude-modulated wave signal or one for deriving the modulation-signal components of a frequency-modulated wave signal, for the purpose of describing a particular embodiment of the present invention it will be considered to be a detector for amplitude-modulated wave signals. A filter network 38 is employed in connection with the detector 14 to derive at terminal 39 a suitable control effect for application to the intermediate-frequency amplifier 12 in a manner to be described subsequently to maintain the amplitude of the signal input to the detector 14 within a relatively narrow range for a wide range of received signal intensities.

It will be understood that the units 10, 11, 12, 16 and 17 just described may be of conventional construction and operation, the details of which are well-known in the art, so that further detailed description and explanation of the operation thereof are unnecessary.

*General operation of Fig. 1 receiver*

Considering briefly the operation of the Fig. 1 receiver as a whole but neglecting for the moment the details of the operation of the signal-translating system 13 which will be explained subsequently, the desired amplitude-modulated wave signal intercepted by the antenna 11 is supplied to the oscillator-modulator 10 and is converted by the latter to an amplitude-modulated intermediate-frequency wave signal which is translated by the output circuit of unit 10 to the intermediate-frequency amplifier 12 for amplification therein. The output signal of the intermediate-frequency amplifier is applied to the detector 14 which derives the audio-frequency modulation components of the received wave signal. These components are, in turn, amplified by the audio-frequency amplifier 15 and are reproduced by the sound-reproducing device 17 in a conventional maner. The automatic-gain-control or AGC bias derived across the network 38 and applied through the terminal 39 to the intermediate-frequency amplifier 12 is effective to maintain the intensity of the signal input to the detector 14 within a relatively narrow range for a wide range of received signal intensities.

*Description of detector-amplifier system 13 of Fig. 1*

Referring now more particularly to Fig. 1 of the drawings, the signal-translating or detector-amplifier system 13 comprises a multiple-unit transistor device 20 including a pair of junction transistors 21 and 22 which have a common zone 25 of semiconductive material and an electrical connection 28 thereto. In accordance with a particular embodiment of the invention, the device 20 is of the grown-junction type comprising a unitary body of semiconductive material arranged in a predetermined pattern of five zones. More particularly, the multiple-unit transistor device 20 includes five successive zones, contiguous ones of which are of the opposite conductivity type. To this end the device includes in the order named a zone 23 of the N conductivity type and zones 24 to 27, inclusive, of alternately opposite conductivity types as shown. It will be understood, however, that device 20 may be of the PNPNP conductivity type and as such would require biasing of the opposite polarity from that represented in the drawing. Zones 23, 24, and 25 comprise, respectively, the emitter, base, and collector of the first transistor 21, while zones 25, 26, and 27 comprise the emitter, base, and collector, respectively, of the second transistor 22.

The system 13 comprises the signal-translating or detector circuit 14 which includes the transistor 21, and further comprises the second signal-translating or audio-frequency amplifier circuit 15 including the transistor 22. The detector circuit 14 includes a signal-input circuit which is coupled between the base 24 and the collector 25 of the transistor 21. This input circuit includes a transformer 31 having its tuned primary winding 32 connected through a pair of input terminals 30, 30 to the intermediate-frequency amplifier 12 and having an intermediate point on its tuned secondary winding 33 connected to the base zone 24. The input circuit further includes a condenser 40 selected to serve as a by-pass condenser for intermediate-frequency and audio-frequency signal currents, a pair of series-connected biasing resistors 48 and 49 connected in parallel with the condenser 40, and a connection between one end of the winding 33 and the junction of the resistors 48 and 49. The output signal or modulation components derived by the detector 14 are developed across its load impedance comprising the parallel combination of a condenser 35 and a resistor 36, one end of the combination being connected to the emitter zone 23 and the other end being connected to a point of fixed potential or ground. The filter network 38 comprises the resistor 51 and the condenser 52 and is connected in the usual manner across the condenser 35. An adjustable tap 37 applies through a condenser 50 to the base 26 of the second transistor a selected portion of the audio-frequency potential developed across the resistor 36. Elements 36 and 37 serve as a volume-control means for the radio receiver and the condenser 50 is ordinarily an electrolytic condenser presenting a low impedance to audio-frequency information which is translated thereby to the audio-frequency amplifier 15. Suitable biasing potentials for the transistor 22 are supplied from a source indicated as +B which is connected to the collector zone 27 through the primary winding 44 of output transformer 45. This source is also connected to ground through a voltage divider comprising series-connected resistors 42 and 43, the junction of which is connected to the base zone 26. The secondary winding 46 of the transformer 45 is connected through a pair of output terminals 47, 47 to the input circuit of the audio-frequency amplifier 16.

The detector-amplifier system 13 includes means in the detector and amplifier circuits 14 and 15 presenting a low impedance to wave signals applied to the input terminals 30, 30 and to the derived audio-frequency components, and this means engages the connection 28 for maintaining the zone 25 which is connected to the detector and amplifier circuits at a point of fixed potential for at least predetermined alternating-current signals translated by those circuits, thereby providing desired independent operation of the detector and amplifier circuits with respect to predetermined alternating-current signals in each of the circuits. This means comprises the condenser 40 with its terminal that is soldered to ground. The condenser 40 is ordinarily one of the electrolytic type.

From the foregoing description it will be seen that the transistor 21 of detector 14 is connected in the common collector relation, that is, the collector zone 25 is common to the input and output circuits thereof. It will further be seen that the transistor 22 of the amplifier 15 is connected in the common emitter relation. The bias supplied to the detector 14 is such that it effectively operates close to cutoff in the absence of an applied signal.

*Operation of detector-amplifier system 13 of Fig. 1*

In considering the operation of the detector-amplifier system 13, it will be assumed initially that the source +B and the various resistors, such as resistors 42, 43, 48, and 49, develop the correct direct-current operating potentials for the transistors 21 and 22. To that end, the detector 14 is effectively biased substantially to cutoff when no signal is applied, as previously mentioned, and, since it is connected in the common collector relation, it functions in a manner similar to an infinite input-impedance detector employing an electron tube. A voltage for automatic-gain-control purposes is obtained from the filter network 38 connected in parallel with the detector load impedance 35, 36. The modulated intermediate-frequency wave signal applied to the input terminals 30, 30 of the system 13 is translated by the tuned windings of the transformer 31 and applied by the connection from the winding 33 and by the resistor 48 to the collector 25 and the base 24 of the transistor 21. A rectified emitter current constituting the derived audio-frequency modulation components of the intermediate-frequency wave signal flows and builds up a voltage across the load impedance comprising the condenser 35 and the resistor 36. A substantial power gain is realized although it is smaller than that which may be obtained from a common emitter or a common base type of amplifier circuit. The audio-frequency voltage appearing across the network 35, 36 is filtered by the network 38 and applied as a positive-going automatic-volume-control potential in the well-known manner to a suitable electrode, such as the base of the transistor of the intermediate-frequency amplifier 12, to maintain the signal input to the detector circuit 14 within a relatively narrow range for a wide range of received signal intensities.

A selected portion of the audio-frequency voltage developed across the resistor 36 is applied by the adjustable tap 37 through the condenser 50 to the input circuit of amplifier 15 comprising the base 26 of transistor 22 and the emitter 25 thereof. Transistor 22 is connected in the common emitter relation, and its emitter zone 25, which is also the collector zone of the transistor 21, is maintained at the point of fixed potential or ground for signal currents by the by-pass condenser 40. An amplified replica of the applied signal appears at the collector zone 27 and is applied by the transformer 45 and output terminals 47, 47 to the audio-frequency amplifier 15 for further amplification therein. The common emitter amplifier circuit 15 affords a higher power gain than a similar amplifier connected either in the common collector or the common base relationship. The output signal from terminals 47, 47 has a higher power gain than may be realized with a conventional diode or crystal detector in cascade with a transistor audio-frequency amplifier such as unit 15. The potentiometer comprising elements 36 and 37 constitutes a relatively simple and practical volume-control means for the radio receiver.

The described circuits for the multiple-unit transistor device 20 include as a feature thereof the condenser 40 which serves as a by-pass condenser for signal currents in each of the two circuits, that is, as an intermediate-frequency by-pass element for intermediate-frequency signals appearing in the detector circuit 14 and as an audio-frequency by-pass element for audio-frequency signals translated by the amplifier circuit 15. As a result, the two transistors 21 and 22, while having a common zone 25 in the single body of five successive contiguous zones of semiconductive material, are capable of independent operation in their respective circuits with respect to the alternating-current signals in each of those circuits. It will be clear that the signals under consideration occupy distinctly different portions of the frequency spectrum. However, a signal-translating system in accordance with the invention is not necessarily limited to the translation of signals in widely different portions of the spectrum since circuit parameters may be employed such that the system translates in the two portions thereof signals occupying the same frequency range.

While applicant does not intend to limit the invention to any particular design constants, the following are appropriate for a particular embodiment of the invention:

| | | |
|---|---|---|
| Resistor 36 | kilohms (max.) | 2 |
| Resistor 42 | kilohms | 10 |
| Resistor 43 | do | 22 |
| Resistor 48 | do | 1 |
| Resistor 49 | ohms | 220 |
| Resistor 51 | kilohms | 4.7 |
| Condenser 35 | microfarads | 0.05 |
| Condenser 40 | do | 100 |
| Condensers 50 and 52 | do | 10 |
| +B | volts | 9 |
| Resonant frequency of transformer 31 | kilocycles | 455 |

*Description of converter intermediate-frequency amplifier of Fig. 2*

Referring now to Fig. 2 of the drawings, there is represented a signal-translating system 70 in accordance with the invention which serves as a converter intermediate-frequency amplifier system for use in an environment comparable to that of the oscillator-modulator 10 and one stage of the intermediate-frequency amplifier 12 of the radio receiver of Fig. 1. The system, like that of Fig. 1, comprises a multiple-unit grown-junction transistor device 60 including a pair of transistors 61 and 62 having a common zone 65. Device 60 has contiguous NPNPN zones 63–67, inclusive. Zones 65–67, inclusive, comprise respectively the collector, base, and emitter of the transistor 61 for the autodyne-frequency converter or oscillator-modulator 74 of the system 70 while zones 63–65, inclusive, comprise corresponding elements of the transistor 62 of the intermediate-frequency amplifier 75 thereof.

Radio-frequency wave signals intercepted by the antenna 11 are inductively coupled to a winding 78 which is connected in series with a winding 77 between the base 66 and the emitter 67 of transistor 61 through coupling condensers 106 and 71. A source of potential —B is connected to one terminal of a winding 83 which is tuned to a selected local oscillator frequency by means of an adjustable condenser 84 having one of its terminals grounded. Windings 83 and 77 are respectively the primary and secondary windings of a transformer 86. An intermediate point on winding 83 is connected to one terminal of winding 81 which is tuned to the desired intermediate-frequency signal by means of a condenser 82. An intermediate point on the winding 81 is connected to the junction of the condensers 106 and 71 and the latter has a biasing resistor 72 connected in parallel therewith. A unidirectional source of biasing potential is connected through a resistor 85 to the junction of the winding 77 and the condenser 106. Zone 65, which serves not only as the collector of transistor 61 but also as the emitter of transistor 62, is conductively connected to ground by way of an electrical connection 68. The circuit just described constitutes the frequency converter or oscillator-modulator 74 of system 70 and it will be seen that the transistor 61 of the oscillator-modulator is of the common emitter type and hence is capable of promoting full use of the capabilities of that circuit.

The winding 81 is the primary winding of a transformer 87 and its secondary winding 88 supplies the intermediate-frequency signal derived by the oscillator-modulator 74 to the intermediate-frequency amplifier 75 of unit 70. To this end, one terminal of the winding 88 is connected to ground for alternating currents through an AGC input terminal 134 and a filter condenser 137 while the other terminal is connected directly to the base 64 of transistor 62 of amplifier 75. A suitable operating bias for the base 64 of transistor 62 is supplied through winding 88 by way of a source +B connected across a voltage divider comprising a resistor 89, filter resistor 133, and a resistor 130 in the circuit of a receiver second detector and AGC supply 121. The output signal derived at the collector 63 of amplifier 75 is applied to an intermediate point on a primary winding 146 of interstage transformer 108, that winding being tuned to the desired intermediate frequency by a suitable condenser 107. The transistor 62 of the amplifier 75 is connected in the common emitter configuration. The interstage transformer 108 supplies by way of its secondary winding 109 and output terminals 110, 110 intermediate-frequency signals to a second intermediate-frequency amplifier not shown).

*Operation of converter intermediate-frequency amplifier of Fig. 2*

Received radio-frequency wave signals selected by the antenna 11 are applied by the windings 78 and 77, the condenser 106, and the condenser 71 between the base 66 and the emitter 67 of the transistor 61 of the oscillator-modulator 74. The latter functions as an autodyne-frequency converter and local oscillations developed in the tuned circuit 83, 84 are heterodyned with the received wave signals to develop by virtue of the nonlinear signal-translating characteristic of the transistor 61 the desired intermediate-frequency wave signal in the tuned circuit 81, 82. This signal is applied between the emitter and the base of the transistor 62 by winding 88 of interstage transformer 87, the filter condenser 137, and the grounded connection 68 and there is developed with power gain across the tuned circuit 107, 146 connected to the collector 63 an intermediate-frequency output signal. The latter is applied by winding 109 to the output terminals 110, 110 of unit 70. A unidirectional gain-control potential derived by the audio-frequency filter network 133, 137 of unit 121 is applied by way of the terminal 134 to the base 64 of transistor 62 of the first intermediate-frequency amplifier 75 and is effective to maintain the amplitude of the signal input to the detector of unit 121 within a relatively narrow range for a wide range of received signal intensities.

An extremely important advantage which a system employing multiple-unit junction transistor devices of the type shown in Figs. 1 and 2 is represented in the savings in cost. The transistors in transistor systems represent a major cost item and a material saving in the manufacturing costs may be realized with multiple-unit junction transistor devices since their cost is approximately 70 percent of the cost of two transistors. Present indications are that mass production of multiple-unit junction transistor devices will in the future increase this saving.

While there have been described what are at present considered to be the preferred embodiments of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. A signal-translating system comprising: a multiple-unit transistor device including a pair of junction transistors which have a common zone of semiconductive material serving as the collector of one of said transistors and as the emitter of the other of said transistors; an electrical connection to said common zone; a first signal-translating circuit including one of said transistors and a second signal-translating circuit including the other thereof; means for coupling a signal input terminal of said first circuit and a signal output terminal of said second circuit to a common point of reference potential for respective alternating-current signals respectively translated by said circuits; and means in said circuits and engaging said connection for maintaining said zone at said reference potential for at least such translated alternating-current signals; thereby providing desired independent operation of said first and second circuits with respect to those alternating-current signals respectively in each of said circuits.

2. A signal-translating system comprising: a multiple-unit transistor device including a pair of junction transistors which have a common zone of semiconductive material serving as the collector of one of said transistors and as the emitter of the other of said transistors; an electrical connection to said common zone; a first signal-translating circuit including one of said transistors and a second signal-translating circuit including the other thereof; means for coupling a signal input terminal of said first circuit and a signal output terminal of said second circuit to a common point of reference potential for respective alternating-current signals respectively translated by said circuits; and a condenser in said circuits and engaging said connection for maintaining said zone at said reference potential for such translated alternating-current signals; thereby providing desired independent operation of said first and second circuits with respect to those alternating-current signals respectively in each of said circuits.

3. A signal-translating system comprising: a multiple-unit transistor device including a pair of junction transistors which have a common zone of semiconductive material serving as the collector of one of said transistors and as the emitter of the other of said transistors; an electrical connection to said common zone; a first signal-translating circuit including one of said transistors and a second signal-translating circuit including the other thereof; means for coupling a signal input terminal of said first circuit and a signal output terminal of said second circuit to a common point of reference potential for respective alternating-current signals respectively translated by said circuits; and means in said circuits conductively connected to said connection for maintaining said zone at said reference potential for at least such translated alternating-current signals; thereby providing desired independent operation of said first and second circuits with respect to at least those alternating-current signals respectively in each of said circuits.

4. A signal-translating system for a radio receiver comprising: a multiple-unit transistor device including a pair of junction transistors which have a common zone of semiconductive material and an electrical connection thereto; a modulation-signal detector circuit including one of said transistors for deriving the audio-frequency modulation components of an applied modulated wave signal and an audio-frequency amplifier circuit including the other of said transistors coupled in cascade with said detector circuit; means for coupling a signal input terminal of said detector circuit and a signal output terminal of said amplifier circuit to a common point of reference potential for wave signals and derived signal components respectively translated by those circuits; and a condenser in said circuits presenting a low impedance to said wave signal and said derived components and engaging said connection for maintaining said zone at said reference potential for such translated alternating-current signals; thereby providing desired independent operation of said detector and amplifier circuits with respect to said wave signal and derived signal components respectively in each of said circuits.

5. A signal-translating system for a radio receiver comprising; a multiple-unit transistor device including a pair of junction transistors which have a common zone of semiconductive material and an electrical connection thereto; a modulation-signal detector circuit including one of said transistors biased substantially to cutoff in the absence of an applied modulated wave signal for deriving the modulation components thereof; an audio-frequency amplifier circuit including the other of said transistors coupled in cascade with said detector circuit; means for coupling a signal input terminal of said detector circuit and a signal output terminal of said amplifier circuit to a common point of reference potential for wave signals and derived signal components respectively translated by those circuits; and a condenser in said circuits and engaging said connection for maintaining said zone at said reference potential for at least such translated alternating-current signals; thereby providing desired independent operation of said detector and amplifier circuits with respect to said wave signal and derived signal components respectively in each of said circuits.

6. A signal-translating system comprising: a multiple-unit transistor device including a pair of junction transistors which have a common zone of semiconductive material and an electrical connection thereto; a modulation-signal detector circuit including one of said transistors coupled in the common collector relation for deriving the audio-frequency modulation components of an applied modulated wave signal; an audio-frequency amplifier circuit including the other of said transistors coupled in the common emitter relation and in cascade with said detector; means for coupling a signal input terminal of said detector circuit and a signal output terminal of said amplifier circuit to a common point of reference potential for wave signals and derived signal components respectively translated by those circuits; and means in said circuits and engaging said connection for maintaining said zone at said reference potential for at least such translated alternating-current signals; thereby providing desired independent operation of said detector and amplifier circuits with respect to said wave signal and derived signal components respectively in each of said circuits.

7. A signal-translating system comprising: a multiple-unit transistor device including a pair of junction transistors which have a common zone of semiconductive material and an electrical connection thereto; a modulation-signal detector circuit including one of said transistors coupled in the common collector relation and further including an emitter load impedance for deriving thereacross the audio-frequency modulation components of an applied modulated wave signal; an audio-frequency amplifier circuit including the other of said transistors coupled in the common emitter relation; means coupled to said impedance and said amplifier circuit for coupling said circuits in cascade and for controlling the gain of said amplifier circuit; means for coupling a signal input terminal of said detector circuit and a signal output terminal of said amplifier circuit to a common point of reference potential for wave signals and derived signal components respectively translated by those circuits; and means in said circuits and engaging said connection for maintaining said zone at said reference potential for at least such translated alternating-current signals; thereby providing desired independent operation of said detector and amplifier circuits with respect to said wave signal and derived signal components respectively in each of said circuits.

8. A signal-translating system comprising: a multiple-unit transistor device including a pair of junction transistors which have a common zone of semiconductive material and an electrical connection thereto; a frequency-converter circuit including one of said transistors and a signal-translating circuit including the other thereof coupled to said converter circuit; means coupling a signal input terminal of said converter circuit and a signal output terminal of said translating circuit to a common point of reference potential for respective alternating-current signals respectively translated by said circuits; and means in said circuits and engaging said connection for maintaining said zone at said reference potential for at least such translated alternating-current signals; thereby providing desired independent operation of said circuits with respect to those alternating-current signals respectively in each of said circuits.

9. A signal-translating system comprising: a multiple-unit transistor device including a pair of junction transistors which have a common zone of semi-conductive material and an electrical connection thereto; a frequency-converter circuit including one of said transistors and an amplifier circuit including the other thereof coupled in cascade with said converter circuit; means for coupling a signal input terminal of said converter circuit and a signal output terminal of said amplifier circuit to a common point of reference potential for respective alternating-current signals respectively translated by said circuits; and means in said circuits and engaging said connection for maintaining said zone at said reference potential for at least such translated alternating-current signals; thereby providing desired independent operation of said converter and amplifier circuits with respect to those alternating-current signals respectively in each of said circuits.

10. A signal-translating system for a radio receiver comprising: a multiple-unit transistor device including a pair of NPN junction transistors which have a common zone of semiconductive material and an electrical connection thereto; an autodyne-frequency converter circuit including one of said transistors and responsive to an applied radio-frequency signal and local oscillations developed therein for deriving an intermediate-frequency signal; an intermediate-frequency amplifier circuit including the other transistor coupled in cascade with said converter circuit; means for coupling a signal input terminal of said converter circuit and a signal output terminal of said amplifier circuit to a common point of reference potential for radio-frequency and intermediate-frequency signals respectively translated by those circuits; and means in said circuits and engaging said connection for maintaining said zone at said reference potential for at least such translated alternating-current signals; thereby providing desired independent operation of said converter and amplifier circuits with respect to said radio-frequency and intermediate-frequency signals respectively in each of said circuits.

11. A signal-translating system comprising: a multiple-unit transistor device including a pair of junction transistors comprising a unitary body of semiconductive material arranged in a predetermined pattern of five zones, contiguous ones of which are of opposite conductivity types, one of said zones constituting the emitter electrode of the first transistor, another the base electrode thereof, another the collector electrode thereof and the emitter electrode of the second transistor, another the base electrode of said second transistor, and another its collector electrode; an electrical connection to said zone constituting the collector electrode of said first transistor and the emitter electrode of said second transistor; a first signal-translating circuit including said first transistor with a signal input circuit coupled between predetermined electrodes thereof and a second signal-translating circuit including said second transistor with a signal output circuit coupled between predetermined electrodes thereof; means for coupling one terminal of each of said signal input and signal output circuits to a common point of reference potential for respective alternating-current signals respectively translated by said circuits; and means in said circuits and engaging said connection for maintaining said collector electrode of said first transistor and said emitter electrode of said second transistor at said reference potential for at least such translated alternating-current signals; thereby providing desired independent operation of said first and second circuits with respect to those alternating-current signals respectively in each of said circuits.

12. A signal-translating system comprising: a multiple-unit transistor device including a pair of junction transistors comprising a unitary body of semiconductive material arranged in a predetermined pattern of five zones, contiguous ones of which are of opposite conductivity types, one of said zones constituting the emitter of the first transistor, another the base thereof, another the collector thereof and the emitter of the second transistor, another the base of said second transistor, and another its collector; an electrical connection to said zone constituting the collector of said first transistor and the emitter of said second transistor; a first signal-translating circuit including said first transistor with a signal input circuit coupled between said base and collector thereof and a second signal-translating circuit in cascade with said first circuit and including said second transistor with a signal output circuit coupled between said collector and said emitter thereof; means for coupling one terminal of each of said signal input and signal output circuits to a common point of reference potential for respective alternating-current signals respectively translated by said circuits; and means in said circuits and engaging said connection for maintaining said collector of said first transistor and said emitter of said second transistor at said reference potential for at least such translated alternating-current signals; thereby providing desired independent operation of said first and second circuits with respect to those alternating-current signals respectively in each of said circuits.

13. A signal-translating system comprising: a multiple-unit transistor device including a pair of junction transistors comprising a unitary body of semiconductive material of five successive zones, contiguous ones of which are of opposite conductivity types, the first of said zones constituting the emitter of the first transistor, the second the base thereof, the third the collector of said first transistor and the emitter of the second transistor, the fourth the base of said second transistor, and the fifth the collector thereof; an electrical connection to said third zone; a first signal-translating circuit including said first transistor with a signal input circuit coupled between said base and collector thereof and a second signal-translating circuit in cascade with said first circuit and including said second transistor with a signal output circuit coupled between said collector and emitter thereof; means for coupling one terminal of each of said signal input and signal output circuits to a common point of reference potential for respective alternating-current signals respectively translated by said circuits; and means in said circuits and engaging said connection for maintaining said third zone at said reference potential for at least such translated alternating-current signals; thereby providing desired independent operation of said first and second circuits with respect to those alternating-current signals respectively in each of said circuits.

References Cited in the file of this patent

UNITED STATES PATENTS

| | | |
|---|---|---|
| 2,569,347 | Shockley | Sept. 25, 1951 |
| 2,595,496 | Webster | May 6, 1952 |
| 2,660,624 | Bergson | Nov. 24, 1953 |
| 2,662,976 | Pantchechnikoff | Dec. 15, 1953 |
| 2,663,806 | Darlington | Dec. 22, 1953 |
| 2,853,602 | Farber | Sept. 23, 1958 |